United States Patent [19]
Ma

[11] 3,983,490
[45] Sept. 28, 1976

[54] SIGNAL OVERLOAD PROTECTION CIRCUIT FOR VARACTOR TUNER

[75] Inventor: John Y. Ma, Glenview, Ill.

[73] Assignee: Zenith Radio Corporation, Chicago, Ill.

[22] Filed: Aug. 5, 1975

[21] Appl. No.: 602,172

[52] U.S. Cl. .............................. 325/452; 325/319; 325/362; 325/368; 325/464; 334/15
[51] Int. Cl.² ........................................ H04B 1/18
[58] Field of Search .................... 325/452–454, 325/458–465, 368, 369, 319, 362, 457; 334/15

[56] References Cited
UNITED STATES PATENTS

| | | | |
|---|---|---|---|
| 3,600,684 | 8/1971 | Cherry | 325/362 X |
| 3,613,008 | 10/1971 | Jabbar | 325/362 X |
| 3,622,887 | 11/1971 | Byles | 325/362 |

Primary Examiner—Robert L. Richardson
Attorney, Agent, or Firm—Nicholas A. Camasto

[57] ABSTRACT

An abrupt junction type varactor diode television tuner includes a source of DC tuning voltage supplying bias to the diodes for tuning the tuner to broadcast television signals. The varactor diode in the RF amplifier stage is connected to the source of tuning voltage through a very large resistance which provides automatic signal overload protection.

8 Claims, 1 Drawing Figure

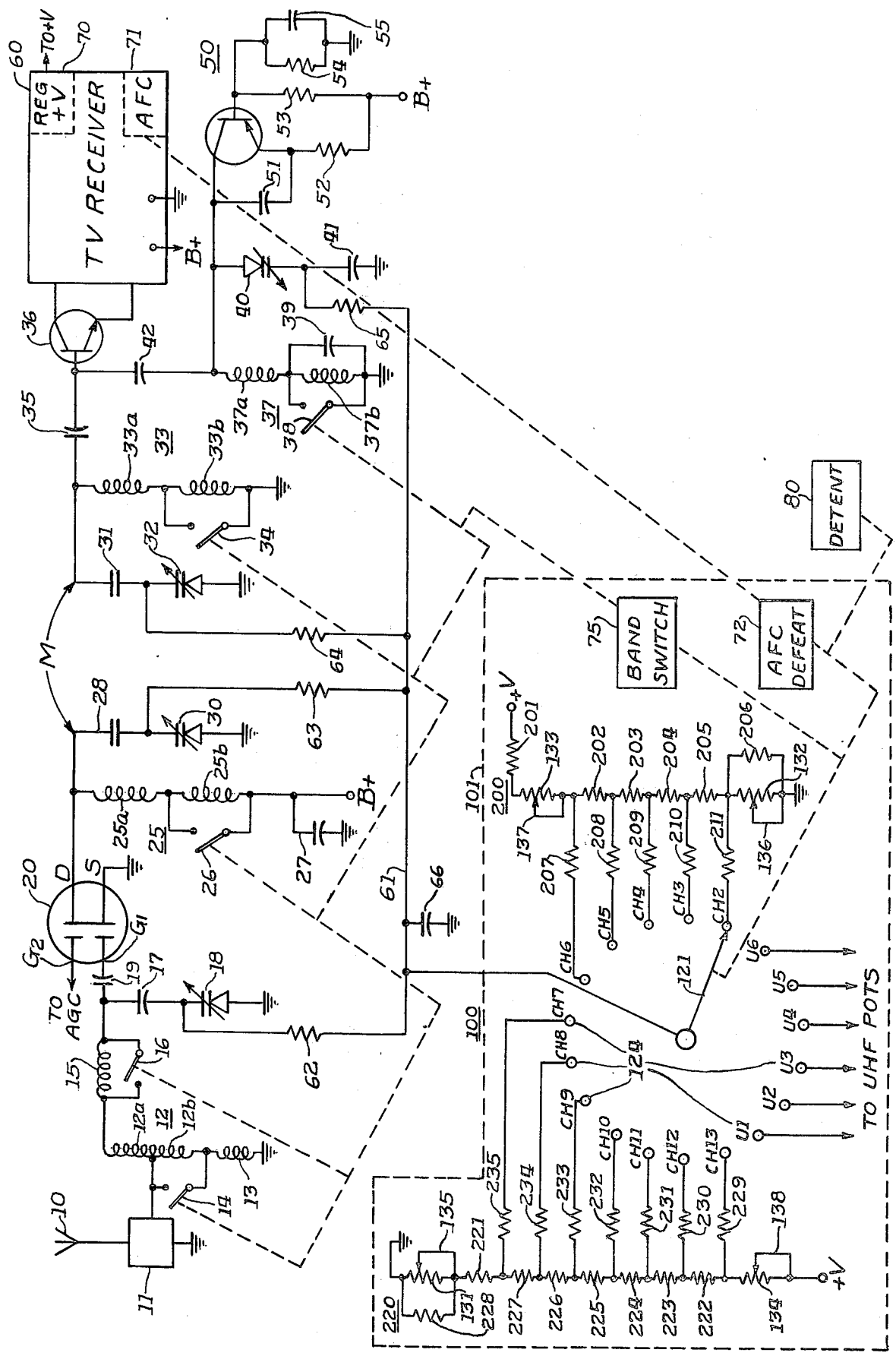

SIGNAL OVERLOAD PROTECTION CIRCUIT FOR VARACTOR TUNER

RELATED PATENT APPLICATIONS

This application is related to, but not dependent upon, copending applications Ser. No. 494,449, filed Aug. 5, 1974, and Ser. No. 502,482, filed Sept. 3, 1974, in the name of John Ma and assigned to Zenith Radio Corporation, and both of which are hereby incorporated by reference into this application.

BACKGROUND OF THE INVENTION

All present varactor diode television tuners in the United States incorporate varactor diodes of the so-called hyperabrupt junction type. These diodes are characterized by a large capacitance ratio, that is, the ratio of the minimum to maximum capacitance exhibited by the diode under varying bias voltage conditions. One of the major considerations in using varactor diodes in tuners is that of getting the diode capacitance-changes-with-tuning-voltage-changes to track in the various tuner stages. Presently, tuner diodes are sorted a number of times to obtain a diode kit (group of selected diodes of corresponding characteristics) for use in a single tuner. Failure of any diode generally means that all diodes in the tuner are replaced with those in another kit. As may be expected, the sorting operations limit the diode "yield" and impose a substantial cost burden on these diodes. Additionally, there are other ancillary costs associated with manufacturing and servicing because of the need to maintain the integrity of the diode kits, both in the factory and in the service shop.

Even with hyperabrupt junction diodes, it is not feasible to cover the entire United States VHF tuning frequency range without employing some form of bandswitching. Bandswitching is generally accomplished by providing for a high and low inductance value in each tunable stage and switching to obtain a different inductance value to enable a given range of varactor diode tuning capacitance to tune over a different frequency range. Most varactor diode tuners incorporate mechanical switches for bandswitching. A very attractive automatic system is disclosed in U.S. Pat. No. 3,646,450 issued Feb. 29, 1972 to John Ma, assigned to Zenith Radio Corporation. In that patent a plurality of steering diodes selectively short out inductive elements upon occurence of a preselected tuning voltage (corresponding to the frequency gap between channels 6 and 7).

The most attractive advantage of abrupt junction varactor diodes is that their capacitance ratios, i.e., capacitance change vs. tuning voltage characteristic are predictable. These diodes may be incorporated in television tuners without being subjected to elaborate sorting and, as fully described in the above-entitled applications, it is sufficient to match their minimum and maximum capacitances. Indeed, with the highly stable precision resistor divider assembly disclosed and claimed in application Ser. No. 502,482, it is feasible to specify only one end point for the abrupt junction diodes.

In varactor diode tuners, the effective tuning voltage range that may be employed is limited at one end by the diode voltage breakdown characteristic and, at the other end, by the tuner signal handling capability. The limited capacitance change available with abrupt junction diodes may present some difficulties in strong signal areas at the lower VHF channel tuning voltages. For example, the tuning voltage for channel 2 may be on the order of −0.9 volts DC and the forward conduction voltage for the silicon type varactor diode is +0.7 volts DC. Consequently, if the peak-to-peak signal voltage exceeds 3.2 volts across the diode, the varactor diode will be driven conductive on peak positive signal excursions. In certain signal locations this may not be an uncommon occurrence.

Practically, the receiver automatic gain control system usually provides for very large signal gain reductions for the signal in the intermediate frequency stages of the receiver and in the interstage coupling of the tuner. Thus it is the antenna or RF input stage of the tuner which is subject to the signal overload condition with which this invention is concerned.

When the nature of the television signal is considered, it will be seen that the peak portions represent synchronizing pulse information. An overload condition can thus distort or destroy the synchronizing pulses in the signal, rendering the information unrecoverable for viewing.

OBJECTS OF THE INVENTION

A principal object of this invention is to provide an improved television receiver.

A further object of the invention is to provide novel signal overload protection in a varactor tuner.

SUMMARY OF THE INVENTION

In accordance with the invention a television tuner includes a plurality of varactor diodes functioning as the variable capacitance elements in a corresponding plurality of tunable circuits. Tuning voltage means apply tuning voltages to bias the diodes, thus enabling their capacitances to tune the tunable circuits to receive and translate broadcast television signals in a given frequency spectrum. The maximum and minimum capacitances exhibited by the abrupt junction diodes are such that over a certain portion of the frequency spectrum the magnitude of the broadcast television signals may significantly exceed the magnitude of the tuning voltage. Limiting means are provided for automatically back-biasing at least one of the varactor diodes under these conditions to preserve signal handling capability of the tuner.

BRIEF DESCRIPTION OF THE DRAWING

The drawing represents a combination block and schematic diagram of a tuner incorporating the invention.

DESCRIPTION OF THE PREFERRED EMBODIMENT

The drawing is a schematic diagram of the preferred embodiment of the invention. An antenna 10 is coupled to an IF filter 11 which includes well-known trapping circuitry for preventing wave signals of television intermediate carrier frequencies from being coupled to the tuner. The signal from the IF filter is fed to a first tunable circuit which includes an inductor 12, having a tap dividing it into sections 12a and 12b, an inductor 13, an inductor 15, a DC blocking capacitor 17 and a varactor diode 18 of the abrupt junction type. The output of IF filter 11 is connected to the tap on inductor 12. Inductors 12 and 13 are serially connected and the other end of inductor 13 is grounded. A bandswitch 14 is connected across section 12b of inductor 12 and, when closed, shorts out section 12b leaving section 12a of inductor 12 serially connected between inductors 13 and 15. Another bandswitch 16 is connected across inductor 15.

As is well known, the signal output of a tank circuit is a function of the signal input and the Q of the tank. Normal antenna tank circuits have a Q of about 3–5. Therefore, a 1 volt peak-to-peak signal from filter 11 may try to produce a 3–5 volt signal across capacitor 17 and varactor diode 18.

The tuner has five bandswitches which for convenience are indicated as single-pole, single-throw switches operated in unison as indicated by the dashed lines joining the switch elements. In practice the bandswitches comprise well-known diode switch arrangements rather than mechanical devices.

An RF amplifier, in the form of a dual gate FET 20, has a drain electrode D, a grounded source electrode S, a first gate electrode G1 connected via a coupling capacitor 19 to inductor 15 and a second gate electrode G2 coupled to a source of AGC potential (not shown) which may also be conventional. The junction of inductor 15 and capacitor 19 is connected to blocking capacitor 17 which, in turn, is coupled to varactor diode 18. The anode terminal of diode 18 is connected to ground. A source of DC tuning potential is developed on a tuning line 61, which is coupled to ground through a capacitor 66. The cathode of varactor diode 18 is fed from the tuning line through a large magnitude resistor 62. The capacity exhibited by the varactor diode is a function of the applied tuning voltage and changes therein affect tuning of the first tunable stage.

As will be seen, under normal conditions the varactor diodes in each stage of the tuner are arranged to track each other as the tuner is tuned across the VHF frequency spectrum. However, the Rf stage varactor diode is supplied tuning voltage through a large value resistor 62, which in conjunction with capacitor 66 provides a peak detector action to back bias diode 18 under signal overload (clipping). The back bias results in detuning of the RF stage, but not detuning of the remaining tuner stages.

The drain electrode of RF amplifier 20 is connected to a source of B+ potential through the inductive portion of a second tunable circuit comprising an inductor 25, having sections 25a and 25b, a blocking capacitor 28 and an abrupt junction varactor diode 30. The B+ source is bypassed to ground through a capacitor 27 and a bandswitch 26 is connected in shunting relationship with inductor section 25b. Varactor diode 30 is supplied tuning voltage from tuning line 61 through a relatively low value resistor 63.

A mutual inductance M couples drain terminal D to a third tunable network comprising the series arrangement of a blocking capacitor 31 and an abrupt junction varactor diode 32 paralleled by an inductor 33 having a section 33a and a section 33b. The anode of varactor diode 32 is connected to ground and its cathode is connected to tuning line 61 through a very low value resistor 64. Another bandswitch 34 is connected in shunting relationship with inductor section 33b. The third tunable network is coupled through a capacitor 35 to the base of a mixer transistor 36 which, in turn, is connected to a block 60 labelled TV RECEIVER. This block should be understood to contain all of the well-known circuitry for developing the video and audio representations in the television signals received from mixer 36 as well as the circuitry for generating appropriate power supply voltages.

In this connection, one terminal is indicated as supplying B+ potential to the tuner. Another terminal, connected to a dashed line box 70 labelled REG. +V, supplies a temperature stabilized, regulated source of DC voltage for developing the tuning voltages on the tuning line. Receiver 60 also includes a dashed line box 71, labelled AFC, which will be understood to supply minor corrective tuning voltages to the tuning line as a function of accuracy of tuning, generally measured by the deviation of the actual frequency of the IF signal in the receiver from a standard IF frequency.

An oscillator transistor 50 has its base electrode connected to the junction of a pair of resistors 53 and 55 connected between B+ and ground. The base is bypassed by a capacitor 55 connected in parallel with resistor 54. The emitter electrode of transistor 50 is coupled to its collector electrode through a capacitor 51 and to B+ through a resistor 52. The collector is also coupled to a fourth tunable network comprising an abrupt junction varactor diode 40 serially connected to ground through a capacitor 41 connected in parallel with an inductor 37 having sections 37a and 37b. The cathode of varactor diode 40 is coupled to tuning line 61 through a very low value resistor 65 and its anode is coupled to the junction of blocking capacitor 42 and inductor section 37a. The other end of capacitor 42 is connected to the base of mixer transistor 36. Inductor section 37b is connected to ground and is paralleled by a band-switch 38 and a capacitor 39.

The tuner functions conventionally with the input to the RF amplifier (first tunable circuit) being tunable by varying the tuning voltage on varactor diode 18, the first and second interstage coupling networks (corresponding to the second and third tunable networks, respectively) being tunable by varying the tuning voltage on varactor diodes 30 and 32 and the oscillator being tunable by varying the DC tuning voltage on varactor diode 40 in the fourth tunable network. In accordance with standard television practice, the RF amplifier and the interstage coupling networks are tuned to the frequency of the picture carrier of the incoming signal whereas the oscillator is tuned to a frequency greater than the frequency of the incoming signal picture carrier by an amount equal to the desired IF signal, namely 45.0 MHz. Bandswitches 14, 16, 26, 34 and 38 are open as shown for tuning in the Lo VHF region (corresponding to channels 2–6). When the bandswitches are closed the appropriate inductive sections or elements are shorted out, effectively raising the resonant frequencies of the tuner circuits for tuning in the Hi band regions (channels 7–13). The tuning voltage ranges overlap considerably for these bands because of the abrupt junction varactor diodes. Capacitor 39 is in series with varactor diode 40 to provide the smaller tuning capacitance for the oscillator which is tuned to a higher frequency than the other stages.

A switch assembly 100 includes a ceramic substrate 101 (indicated in dashed lines) with appropriate patterns of deposited conductive connectors and precision voltage dividers 200 and 220 and potentiometer resistance elements 131–134. Details of the switching elements and substrate are of no importance to this particular invention. The arrangement of the switch assembly and the substrate, as well as its combination with a television tuner having abrupt junction varactor diodes is the subject of the above-mentioned copending application Ser. No. 502,482.

Substrate 101 is preferably made of alumina and the resistors in Lo band voltage divider 200 and Hi band voltage divider 200 are made from printed resistive material, which are screened on, baked and laser trimmed to bear a precise ratio to each other. A rotary channel switch wiper 121 sequentially makes connection with a plurality of channel stationary contacts 124 labelled CH2-CH13 and U1-U6. The designation CH stands for a VHF channel, while the U designation indicates a channel in the UHF spectrum. Thus channel switch wiper 121 is sequentially movable over contacts 124 corresponding to VHF channels 2-13 and any six UHF channels.

The Lo band VHF voltage divider 200 comprises a series connection of a resistor 201, potentiometer resistance element 133 having a shorting wiper 137, and resistors 202, 203, 204, 205 and 206 connected between +V and ground. Resistor 206 is bridged by potentiometer resistance element 132 having a shorting wiper 136. An AFC equalizing resistor is connected between the junctions of each pair of resistors in the divider network and the respective one of contacts CH2–CH6. For example, equalizing resistor 207 connects contact CH6 to the junction of potentiometer resistance element 133 and resistor 202, resistor 208 connects CH5 to the junction of resistors 202 and 203 and, in a similar manner, equalizing resistors 209, 210 and 211 connect the corresponding resistor junctions of voltage divider network 200 to contacts CH4, CH3 and CH2, respectively.

Hi band voltage divider 220 includes a series connection from +V of potentiometer resistance element 134 having a shorting wiper 138, resistors 222–227, a resistor 221 and a resistor 228 to ground. Potentiometer resistance element 131 having a shorting wiper 135 is connected across resistor 228. In similar fashion, AFC equalizing resistors 229–235 interconnect the resistor junctions of the divider network to CH7–CH13 terminals.

A block labelled AFC defeat is indicated as being coupled to channel switch wiper 121 and to AFC circuit 71. While the AFC defeat is shown within the confines of substrate 101, any convenient form of AFC defeat may be utilized, its purpose being to disable the AFC circuit 71 between channel switch positions.

A bandswitch control 75 is also indicated as being within the confines of substrate 101 and coupled to channel switch wiper 121. Bandswitch control 75 is shown in operative relationship with the mechanical bandswitches previously described and in the preferred embodiment comprises B+ switching elements mounted on the substrate for supplying a positive potential when the Hi band VHF channels and UHF channels are selected.

A block 80, labelled DETENT, is shown coupled to channel switch wiper 121, though not located within the confines of substrate 101. It will be appreciated by those skilled in the art that detent 80 may comprise any of a well-known number of means for positively positioning channel switch wiper 121 at each of channel stationary contacts 124. The mechanism by which this is performed constitutes no part of this invention and is, therefore, not disclosed in detail.

The remaining channel stationary contacts, labelled U1–U6, are connected to a corresponding plurality of potentiometers or voltage sources of appropriate value (not shown) for receiving selected ones of television signals in the UHF spectrum. Channel switch wiper 121 is connected to tuning line 61 and is shown engaging contact CH2, corresponding to the VHF channel 2 position. In this position, the potential existing at the junction of resistors 205 and 206 in voltage divider 200 is impressed upon tuning line 61 through resistor 211 and applied to the various abrupt junction varactor diodes 18, 30, 32 and 40, through resistors 62–65, respectively.

The AFC equalizing resistors compensate for the nonuniformity of the varactor diode tuning voltage curves throughout the frequency spectrum whereby a given change in AFC voltage at one end of the Hi or Lo bands would have a different frequency correction effect than the same AFC correction voltage at the opposite ends of the bands. The equalizing resistors are selected to provide overall "equal effect" AFC.

The tuning voltage range extends from 1 volt to 25 volts DC. Under normal conditions, the received broadcast signal maximum amplitude is substantially less than the tuning voltage (negative bias) on the varactor diodes. However, when tuned to channel 2, the tuning voltage is about −1 volt and a strong signal could drive the RF stage varactor diode into conduction. Not only would this detune the RF stage, but it would also reduce the tuning line voltage and detune the remaining stages.

Because of the AGC action mentioned previously, only the first or RF stage experiences this particular problem with signal overload. In the invention, resistor 62 which is normally around 22,000 ohms is increased substantially to around 1,000,000 ohms. The effects of the change are dramatic.

Under a signal overload condition, when tuned to channel 2, resistor 62 and capacitor 66 act as a peak detector and back-bias varactor diode 18 when it begins to conduct. Thus only the positive peaks of the incoming signal experience rectification by the varactor and signal distortion is greatly minimized.

Further, conduction of the varactor increases the bias on the diode and effectively tunes the RF stage towards the frequency of the channel 3 television signal. This, of course, further reduces the tuner RF stage response to channel 2, resulting in even greater signal handling capability. Thus an automatic gain reduction occurs.

Finally, the large value of resistor 62 isolates the signal-induced-bias on varactor diode 18 from the tuning line, thus preventing changes in tuning voltage due to first stage clipping and preventing detuning of the other stages. The oscillator stage in particular is most sensitive and greatly benefits from this isolation. Resistor 63 may be on the order of 20,000 ohms, resistors 64 and 65, almost zero ohms and resistor 62, nearly 1,000,000 ohms.

While particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

What is claimed is:
1. A television tuner comprising:
   a tunable circuit including a varactor diode providing the variable capacitance therefor;

means applying a DC tuning voltage to bias said varactor diode for adjusting the resonance of said tunable circuit to receive and translate broadcast television signals in a given frequency spectrum, the maximum and minimum capacitance exhibited by said varactor diode being such that over a certain portion of said frequency spectrum the magnitude of a received broadcast television signal may significantly exceed the magnitude of said DC tuning voltage; and means limiting distortion of said received television signal whenever its magnitude substantially exceeds said DC tuning voltage by automatically back-biasing said varactor diode.

2. A television tuner as set forth in claim 1, wherein said means limiting distortion comprise a peak detector circuit developing bias as a function of the maximum excursion of said television signal.

3. A television tuner as set forth in claim 2, wherein said varactor diode is of the abrupt junction type and wherein said tunable circuit comprises a radio frequency stage.

4. A television tuner as set forth in claim 3, wherein said peak detector circuit comprises a large magnitude resistance coupled between said means applying a DC tuning voltage and said varactor diode.

5. A television tuner comprising:
an RF amplifying stage, an oscillator stage, and a mixer stage;
an abrupt junction varactor diode in each of said stages providing variable tuning capacitance;
means applying DC tuning voltages to said varactor diodes for adjusting the resonances of said stages for selectively receiving broadcast television signals in a predetermined frequency band;
the minimum and maximum capacitance of said abrupt junction varactor diodes being such that at a certain portion of said tuning band a received television signal of excessive magnitude may significantly exceed the tuning voltage applied to the varactor diode in said RF stage; and
means for automatically back-biasing the varactor diode in said RF stage in the presence of an excessive magnitude television signal and thereby limiting distortion of said television signal.

6. A television tuner as set forth in claim 5, wherein said last-mentioned means comprise a peak detector circuit for establishing the bias on said varactor diode in said RF stage in accordance with the peak level of said excessive magnitude television signal.

7. A television tuner as set forth in claim 6, wherein said peak detector circuit includes a large magnitude resistor connected between said means for supplying tuning voltages and the varactor diode in said RF stage.

8. A television tuner as set forth in claim 7, wherein said certain portion of said frequency band embraces a frequency corresponding to VHF channel 2, and wherein said means for automatically back-biasing said varactor diode tunes said RF stage towards the frequency corresponding to VHF channel 3 in the presence of an excessive magnitude television signal corresponding to channel 2.

* * * * *